United States Patent
Kondou

[11] Patent Number: 5,719,811
[45] Date of Patent: Feb. 17, 1998

[54] SEMICONDUCTOR MEMORY DEVICE

[75] Inventor: Kenji Kondou, Tokyo, Japan

[73] Assignee: NEC Corporation, Tokyo, Japan

[21] Appl. No.: 600,847

[22] Filed: Feb. 13, 1996

[30] Foreign Application Priority Data

Feb. 17, 1995 [JP] Japan .................................. 7-053276

[51] Int. Cl.$^6$ ..................................................... G11C 8/00
[52] U.S. Cl. ................... 365/189.06; 365/189.11;
365/202
[58] Field of Search ................. 365/189.06, 202,
365/189.11

[56] References Cited

U.S. PATENT DOCUMENTS

| | | | |
|---|---|---|---|
| 4,903,238 | 2/1990 | Miyatake et al. | 365/189.06 |
| 5,268,874 | 12/1993 | Yamauchi | 365/189.06 X |
| 5,392,243 | 2/1995 | Nakamura | 365/189.06 X |
| 5,508,961 | 4/1996 | Han | 365/189.06 |

OTHER PUBLICATIONS

IEEE Journal of Solid–State Circuits, vol. 30, No. 6, Jun. 1995, Design of 1.28–GB/s High Bandwidth 2–Mb SRAM for Integrated Memory Array Processor Applications, by Tohru Kimura, Kazuyuki Nakamura, Yoshiharu Aimoto, Takashi Manabe, Nobuyuki Yamashita, Yoshihiro Fujita, Shin'ichiro Okazaki, and Masakazu Yamashina, pp. 637–642.

IEEE Journal of Solid–State Circuits, vol. 29, No. 11, Nov. 1994, A 220–MHz Pipelined 16–Mb BiCMOS SRAM with PLL Proportional Self–Timing Generator, by Kazuyuki Nakamura, Shigeru Kuhara, Tohru Kimura, Masahide Takada, Hisamitsu Suzuki, Hiroshi Toshida and Tohru Yamazaki, pp. 1317–1321.

Primary Examiner—Do Hyun Yoo

[57] ABSTRACT

A load element, which is controlled by a control signal acquired by a logical operation of a write/read enable signal and a row address signal, is provided at a pair of digit lines. This structure provides a semiconductor memory device that suppresses a change in the potential difference between the digit line pair, which is caused by a parasitic resistor, to ensure an uniform read delay time and improve the reading speed.

5 Claims, 11 Drawing Sheets

SEMICONDUCTOR MEMORY DEVICE

BACKGROUND OF THE INVENTION

1. Field of the Invention

The present invention relates to a semiconductor memory device, and, more particularly, to a system of controlling the potential difference between a pair of digit lines of the semiconductor memory device at the time of signal reading.

2. Description of the Related Art

Recently, there is an increasing demand for both a faster operation speed and higher integration of fast SRAMs (Static Random Access Memories) in semiconductor memory devices. To meet this demand, various speed improving circuits are used in semiconductor memory devices.

To improve the operation speed, one example of such speed increasing circuits is designed to decrease the time of the inversion of the potentials of a pair of digit lines, which is caused by memory cells, by reducing the potential difference between a pair of digit lines at the time of signal reading.

This scheme is particularly effective for fast SRAMs which are fabricated by using the Bi-CMOS process because those fast SRAMs use bipolar transistors of a large current amplification as sense amplifier elements.

FIG. 1 is a diagram showing a pair of digit lines in a conventional semiconductor memory device and the circuit of a sense amplifier which is connected to the digit line pair. In the diagram, "DL" and "DLB" denote the pair of digit lines, and "TL01" and "TL04" denote load transistors for prevention of floating. "TL02" and "TL03" denote load transistors for controlling the potential difference between the pair of digit lines at the time of signal reading. The load transistors TL02 and TL03 have their gates both connected to WE1, one of write/read enable signals. "R1" shows the parasitic resistors of the digit line pair.

"TS01" and "TS02" denote digit line pair select transistors (hereinafter referred to as DLP select transistors) whose gates are commonly connected to a column address decode signal YJ, and which connect the selected digit line pair to a sense amplifier which is constituted of bipolar transistors TB01, TB02, TB03 and TB04.

"TS03" and "TS04" likewise denote digit line pair select transistors whose gates are commonly connected to a column address decode signal YJB, and which connect the selected digit line pair to a write data bus line.

"CE1" and "CE2" are static memory cells each comprising two load elements and four transistors. The memory cell CE1 is located closest to the load transistors TL01, TL02, TL03 and TL04 and is selected by a word line W0, and the memory cell CE2 is located closest to the select transistors TS01 and TS02, and is selected by a word line Wmax. For diagrammatic simplicity, FIG. 1 shows only two memory cells, the memory cell CE1 at one end on the load transistor side and the memory cell CE2 at one end on the select transistor side.

FIG. 2 is a diagram showing signal waveforms at the time a reading operation of the semiconductor memory device shown in FIG. 1 is performed. FIG. 2 shows the signal waveforms when the internal node N11 of the memory cell CE1 shown in FIG. 1 is set to a high level, the internal node N12 thereof is set to a low level, and the internal nodes N21 and N22 of the memory cell CE2 are respectively at a low level and a high level.

In FIG. 2, "DL1" shows the potential waveform of the end of the digit line DL on the side of the DLP select transistor TS01 (which corresponds to the potential of the digit line DL1 in FIG. 1), and "DLB1" shows the potential waveform of the end of the digit line DLB on the side of the DLP select transistor TS02 (which corresponds to the potential of the digit line DLB1 in FIG. 1). "VDL1" represents the potential difference between the pair of digit lines DL1 and DLB1 when the memory cell CE2 is selected, and "VDL2" represents the potential difference between the pair of digit lines DL1 and DLB1 when the memory cell CE1 is selected.

The operation of the conventional semiconductor memory device will now be described with reference to FIGS. 1 and 2.

When the semiconductor memory device performs a writing operation, the selected pair of digit lines are connected to the write data bus line via the DLP select transistors TS03 and TS04, and the load transistors TL02 and TL03 are turned off not to clamp the amplitudes of the potentials at the digit line pair DL and DLB.

When the semiconductor memory device performs a reading operation, when the memory cell CE2 is selected with the word line Wmax set to a high level, the potential DL1 at the end of the digit line DL on the side of the DLP select transistor TS01 drops by the voltage drop which is caused when the activation current for the memory cell CE2 flows through the series circuit of the ON resistors of the parallel connected load transistors TL01 and TL02 and the parasitic resistor R1 of the digit line DL.

Because the internal node N22 of the memory cell CE2 is at a high level, no activation current flows through digit line DLB, causing no voltage drop, so that the potential DLB1 at the end of the digit line DLB on the side of the DLP select transistor TS02 stays at the supply voltage.

The potential difference VDL1 of the digit line pair when the memory cell CE2 is selected is therefore given by the following equation (1):

$$VDL1=(RTL12+R1) \times IC \qquad (1)$$

where RTL12 is the combined resistance of the ON resistances of the load transistors TL01 and TL02 connected in parallel, and IC is the activation current of the memory cell CE2.

When the memory cell CE1 is selected with the word line W0 set to a high level, the potential DLB1 at the end of the digit line DLB on the side of the DLP select transistor TS02 drops by the voltage drop which is caused when the activation current for the memory cell CE1 flows through the ON resistors of the parallel connected load transistors TL03 and TL04.

Because the internal node N11 of the memory cell CE2 is at a high level, no activation current flows through digit line DL, causing no voltage drop, so that the potential DL1 at the end of the digit line DL on the side of the DLP select transistor TS01 stays at the supply voltage.

The potential difference VDL2 between the digit line pair when the memory cell CE1 is selected is therefore given by the following equation (2):

$$VDL2=RTL34 \times IC \qquad (2)$$

where RTL34 is the combined resistance of the ON resistances of the load transistors TL03 and TL04 connected in parallel, and IC is the activation current of the memory cell CE1.

Normally, the activation current IC of memory cells is approximately 100 µA. The potential difference of complementary signals input to the sense amplifier which is constituted of bipolar transistors should be approximately 100 mV in the light of the operational margin or the like. Therefore, the potential difference of the digit line pair should be approximately 100 mV.

Today, a semiconductor memory device with the memory capacity of 1 Mbits has 512 to 1024 memory cells connected to one pair of digit lines, while a 4-Mbit semiconductor memory device has 1024 to 2048 memory cells connected to one pair of digit lines. The resistance of the parasitic resistor of the pair of digit lines to which, for example, 512 memory cells are connected is approximately 500 Ω, and the parasitic capacitance is about 1 pF.

When the activation current IC of the memory cells is equal to 100 μA and the potential difference VDL2 between the digit line pair with the memory cell CE1 selected is equal to 100 mV, the ON resistance of the transistors as the load elements TL03 and TL04 (or TL01 and TL02) of the digit line pair should be set to RTL34 (=RTL12)=1 kΩ.

When the memory cell CE2 is selected under this condition, the potential difference VDL1 of the digit line pair becomes 150 mV from the following equation (3) if the parasitic resistance R1 of the digit line pair is 500 Ω.

$$VDL1=(1\ k\Omega+500\ \Omega)\times100\ \mu A=150\ mV \quad (3)$$

A description will now be given of the delay time for outputting data to the digit line pair from a memory cell.

When the memory cell CE2 becomes unselected and the memory cell CE1 becomes selected, as mentioned above, the potentials of the digit line pair change in such a way that the word line Wmax is first set to a high level, the potential of the digit line DL1 with the memory cell CE2 selected is the supply voltage minus 150 mV, and the potential of the digit line DLB1 is the supply voltage.

When the word line Wmax goes low from this condition and the word line W0 goes high at the same time, the potential of the digit line DL1 rises to the supply voltage from the supply voltage minus 150 mV, and the potential of the digit line DLB1 drops to the supply voltage −100 mV from the supply voltage.

Suppose that the delay time T1 for the data output to the digit line pair from a memory cell, when the memory cell CE2 is unselected and the memory cell CE1 is selected, ranges from the point when the falling waveform of the word line Wmax cross the rising waveform of the word line W0 to the point when the potential waveforms of the pair of digit lines DL1 and DLB1 on the side of the DLP select transistors TS01 and TS02 cross each other (see FIG. 2).

When the memory cell CE1 becomes unselected and the memory cell CE2 becomes selected, the potentials of the digit line pair change in such a way that the word line W0 is first set to a high level, the potential of the digit line DLB1 with the memory cell CE1 selected is the supply voltage minus 100 mV, and the potential of the digit line DL1 is the supply voltage.

When the word line W0 goes low from this condition and the word line Wmax goes high at the same time, the potential of the digit line DLB1 rises to the supply voltage from the supply voltage minus 100 mV, and the potential of the digit line DL1 drops to the supply voltage −150 mV from the supply voltage.

Suppose that the delay time T2 for the data output to the digit line pair from a memory cell, when the memory cell CE1 is unselected and the memory cell CE2 is selected, ranges from the point when the rising waveform of the word line Wmax cross the falling waveform of the word line W0 to the point when the potential waveforms of the pair of digit lines DL1 and DLB1 cross each other (see FIG. 2). With the parasitic capacitance of the digit line pair being approximately 1 pF, the data output delay time T1 when the memory cell CE2 is unselected and the memory cell CE1 is selected becomes longer by approximately 1 ns to 1.5 ns than the data output delay time T2 when the memory cell CE1 is unselected and the memory cell CE2 is selected.

Because the reading speed of the semiconductor memory device is determined by the reading speed of the slowest memory cell, the difference between those delay times is equivalent to 12.5% to 15% of the operation speed of the semiconductor memory device itself as this operation speed is approximately 8 ns to 10 ns.

According to the conventional semiconductor memory device, as described above, the amplitudes of the potentials of a pair of digit lines at the time of outputting data from memory cells connected to the digit line pair vary depending on the positions of those memory cells. When there is an address transition from a memory cell with a large amplitude (CE2) to a memory cell with a small amplitude (CE1), the level inversion times for the digit line pair become greater as the initial amplitudes of the potentials of the digit line pair are large. This increases the read delay time.

SUMMARY OF THE INVENTION

Accordingly, it is an object of the present invention to provide a semiconductor memory device which suppresses a change in the potential difference between a pair of digit lines caused by a parasitic resistor to ensure a uniform read delay time and improve the reading speed.

To achieve the above object, according to one aspect of this invention, there is provided a semiconductor memory device that is characterized by comprising circuit means for clamping a potential difference between a pair of digit lines, which changes depending on positions of said memory cells at a time of reading said memory cells, to a predetermined level in accordance with positions of said memory cells with respect to said digit line pair.

It is preferable that said circuit means should control a potential difference between said pair of digit lines to be approximately constant when those memory cells which are located at least on a far end side and a near end side with respect to a load circuit of said pair of digit lines are selected.

According to another aspect of this invention, there is provided a semiconductor memory device comprising a memory cell array including an array of a plurality of memory cells arranged in rows and columns, a plurality of digit line pairs each provided for an associated column of memory cells and each connected to said associated column of memory cells, and a plurality of word lines each provided for an associated row of memory cells and each connected to said associated row of memory cells; a plurality of load elements connected to one ends of said plurality of digit line pairs; and a control circuit for performing a predetermined logical operation on a write/read enable signal and a row address signal to produce a control signal for controlling at least one of said plurality of load elements.

It is preferable that said load elements to be controlled by said control circuit should be connected between said digit line pairs at one ends thereof, and should have control terminals connected to an output of said control circuit.

It is further preferable that said load elements to be controlled by said control circuit should be connected between said digit line pairs and a power supply terminal at one ends of said digit line pairs.

The semiconductor memory device of this invention is characterized in that positions of said memory cells at said digit line pairs should be grouped into a plurality of areas, and said control circuit should be designed such that said write/read enable signal indicates a reading operation and an output signal of said control circuit becomes active when said row address signal is located in a predetermined area.

According to this invention, amplitude clamping transistors for a digit line pair, which are controlled by a clamp control signal produced by a predetermined logical operation of a write/read enable signal and a row address signal, are provided at a pair of digit lines, so that an increase in the amplitudes of the potentials of the digit line pair which is caused by the parasitic resistor of the digit line pair and depends on the position of a selected memory cell on the digit lines, is suppressed, thus reducing the read delay time.

In short, according to this invention, since amplitude clamping transistors for a digit line pair, which are controlled by a clamp control signal produced by a predetermined logical operation of a write/read enable signal and a row address signal, are provided at a pair of digit lines, it is possible to suppress an increase in the amplitudes of the potentials of the digit line pair which is caused by the parasitic resistor of the digit line pair and depends on the position of a selected memory cell on the digit lines, thereby reducing the read delay time.

DETAILED DESCRIPTION OF THE PREFERRED EMBODIMENTS

Preferred embodiments of the present invention will now be described with reference to the accompanying drawings.

Figure 1:
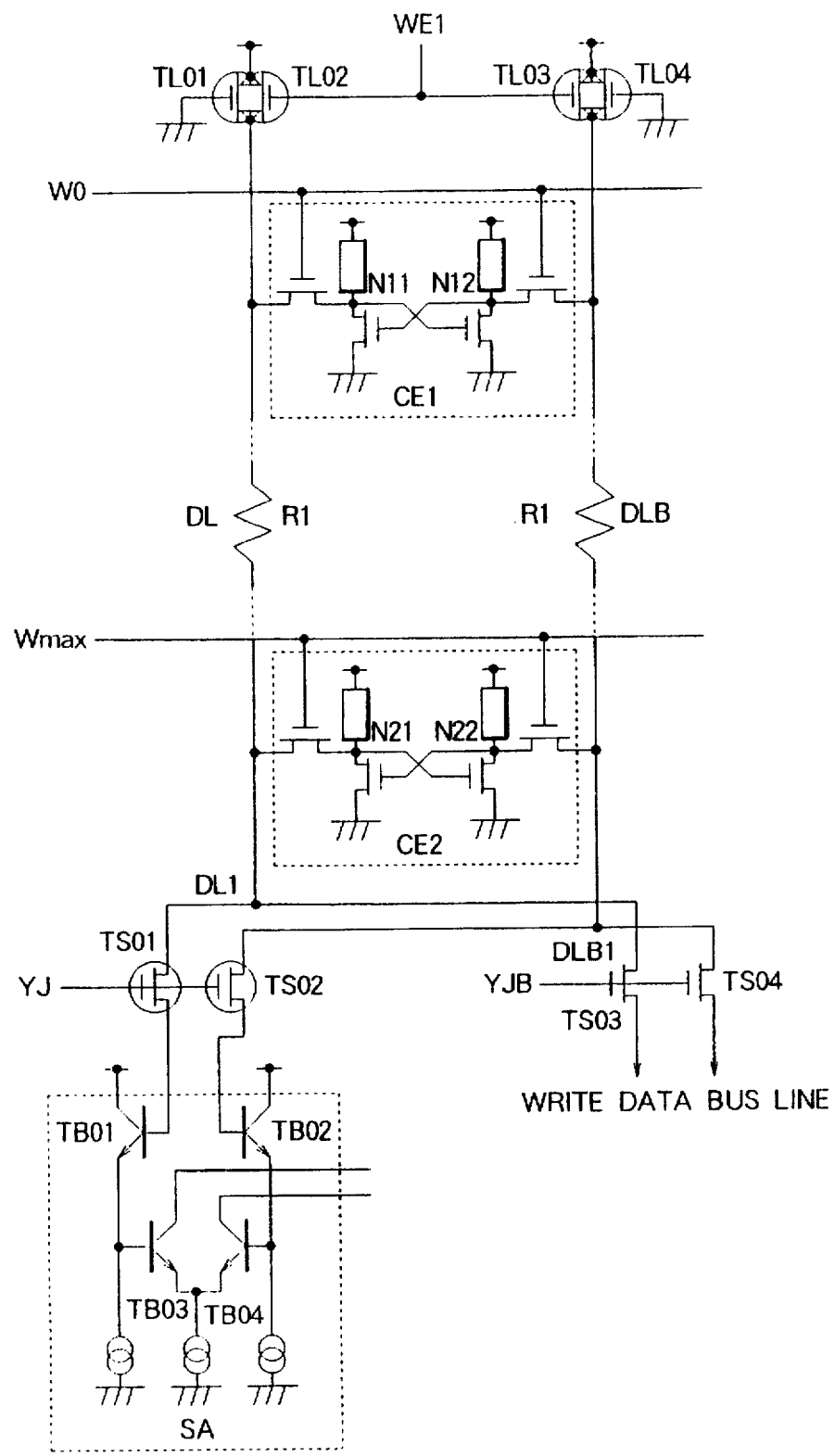
FIG. 1 is a diagram showing the circuit structure of memory cells and a digit line system in a conventional semiconductor memory device.
Figure 2:
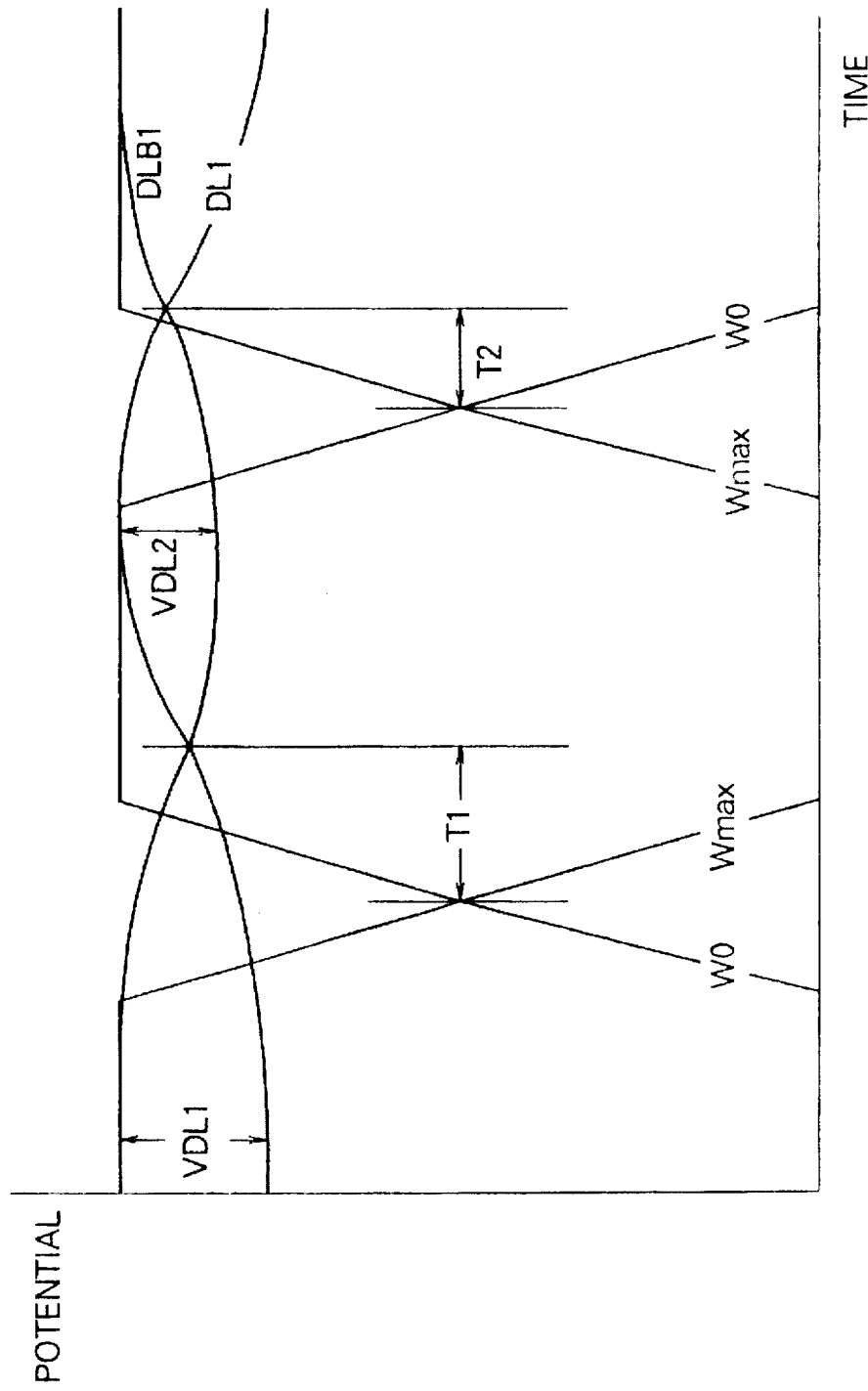
FIG. 2 is a diagram showing signal waveforms for explaining a reading operation of the conventional semiconductor memory device.
Figure 3:
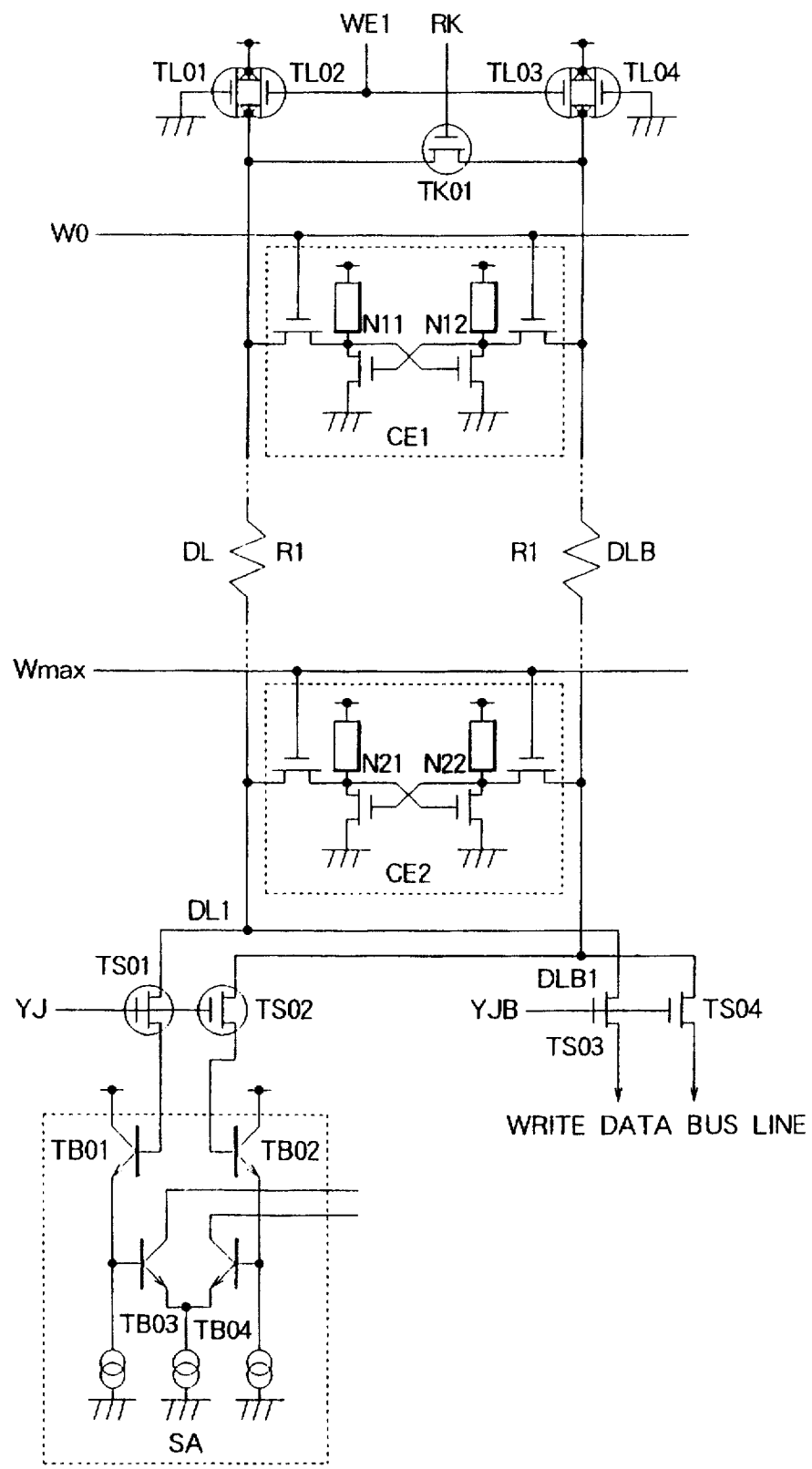
FIG. 3 is a diagram showing the structure of one embodiment of the present invention.

FIG. 3 is a diagram showing a pair of digit lines in a semiconductor memory device according to one embodiment of this invention and the circuit of a sense amplifier which is connected to the digit line pair.

In FIG. 3, "DL" and "DLB" denote the pair of digit lines, and "TL01" and "TL04" denote floating-preventing load transistors whose gates are grounded, and "TL02" and "TL03" denote load transistors for controlling the potential difference between the pair of digit lines at the time of signal reading. The load transistors TL02 and TL03 have their gates both connected to WE1, one of write/read enable signals. "R1" shows the parasitic resistors of the digit line pair.

"TS01" and "TS02" denote digit line pair (DLP) select transistors whose gates are connected to a column address decode signal YJ, and which connect the selected digit line pair to a sense amplifier which is constituted of bipolar transistors TB01, TB02, TB03 and TB04. Likewise, "TS03" and "TS04" denote DLP select transistors whose gates are connected to a column address decode signal YJB, and which connect the selected digit line pair to a write data bus line.

"CE1" and "CE2" are static memory cells each comprising two load elements and four transistors. The memory cell CE1 is located closest to the load transistors TL01, TL02, TL03 and TL04 and is selected by a word line W0.

The memory cell CE2 is located closest to the select transistors TS01 and TS02, and is selected by a word line Wmax. FIG. 3 shows only two memory cells, the memory cell CE1 at one end on the load transistor side and the memory cell CE2 at one end on the select transistor side.

A transistor TK01, connected between the digit line pair DL and DLB at one ends of the digit line pair on the side of the load transistors TL01, TL02, TL03 and TL04, serves to clamp the potential difference between the digit line pair DL and DLB. The gate of this transistor TK01 is connected to a clamp control signal RK which is produced by a predetermined logical operation on the write/read enable signal and a row address signal for selecting an arbitrary memory cell in the memory cell array connected to the digit line pair DL and DLB. The load transistors TL01, TL02, TL03 and TL04, the clamping transistor TK01, and the DLP select transistors TS01 and TS02 are constituted of P type MOS transistors, and the DLP select transistors TS03 and TS04 are constituted of N type MOS transistors. The write/read enable signal WE1 becomes a low level at the time of signal reading, and the transistor TK01 is turned on when the clamp control signal RK has a low level.

Figure 4:
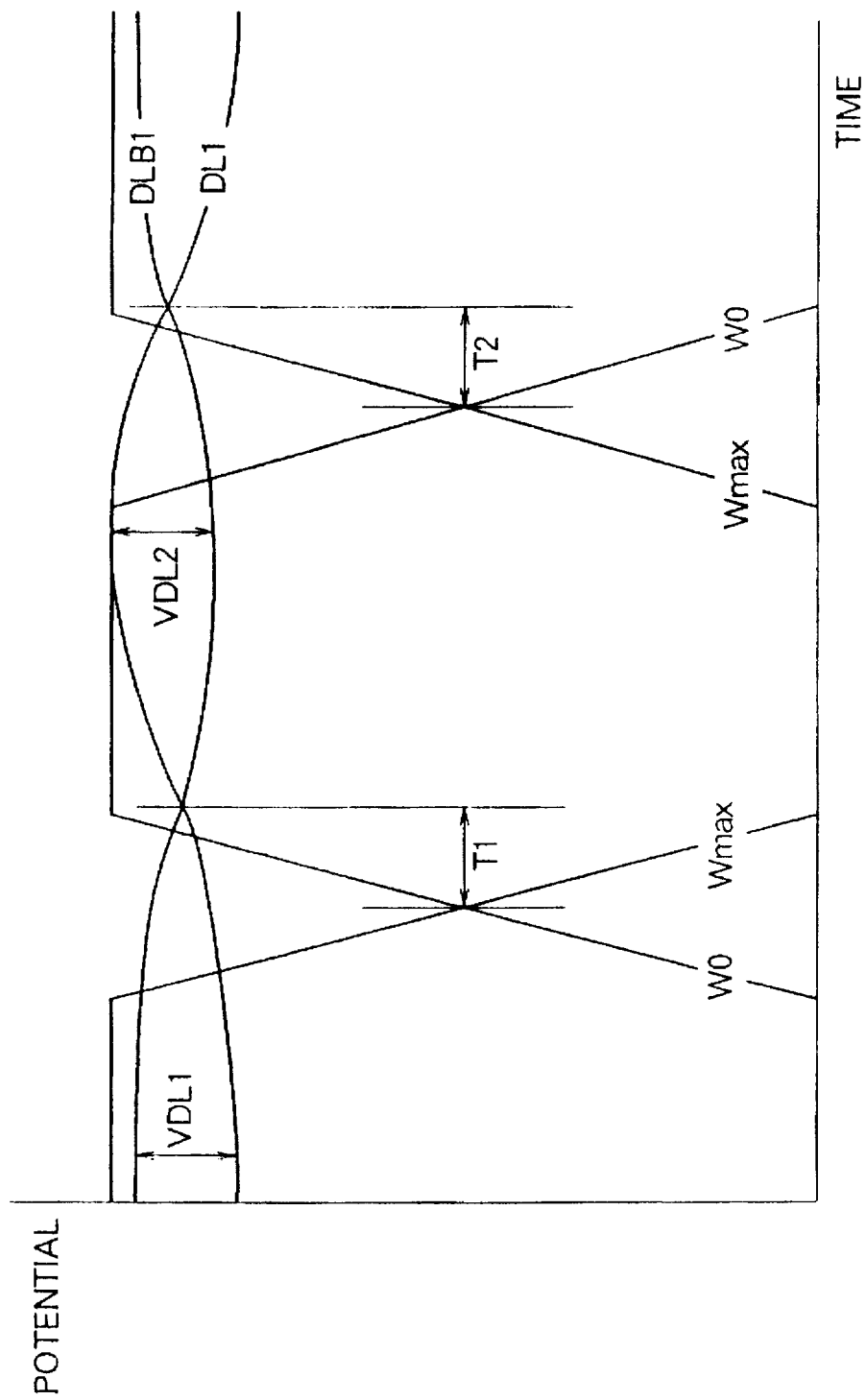
FIG. 4 is a diagram showing signal waveforms for explaining a reading operation of this embodiment.

FIG. 4 shows the operation waveforms for the reading operation of the semiconductor memory device according to this embodiment when the internal node N11 of the memory cell CE1 is at a high level, the internal node N12 thereof is at a low level, the internal node N21 of the memory cell CE2 is at a low level, and the internal node N22 thereof is at a high level. In the diagram, "DL1" shows the potential waveform of the digit line DL on the TS01 side, "DLB1" shows the potential waveform of the digit line DLB on the TS02 side, "VDL1" shows the potential difference of the digit line pair when the memory cell CE2 is selected, and "VDL2" shows the potential difference of the digit line pair when the memory cell CE2 is selected.

Figure 7A:
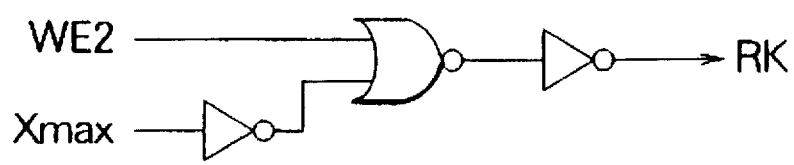
FIG. 7A is a diagram showing the circuit structure of a clamp control signal generator according to one embodiment of this invention.
Figure 7B:
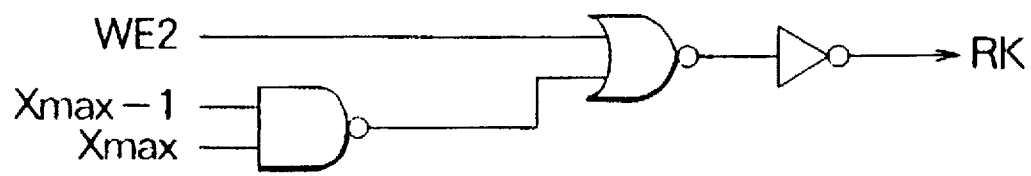
FIG. 7B is a diagram showing another circuit structure of the clamp control signal generator according to one embodiment of this invention.

FIGS. 7A and 7B present logic circuit diagrams of a circuit for generating the clamp control signal RK. In the diagrams, "WE2" denotes a write/read enable signal, Xmax indicates the most significant bit of the row address signal, and Xmax−1 indicates a bit lower by one bit from the most significant bit.

Figure 9A:
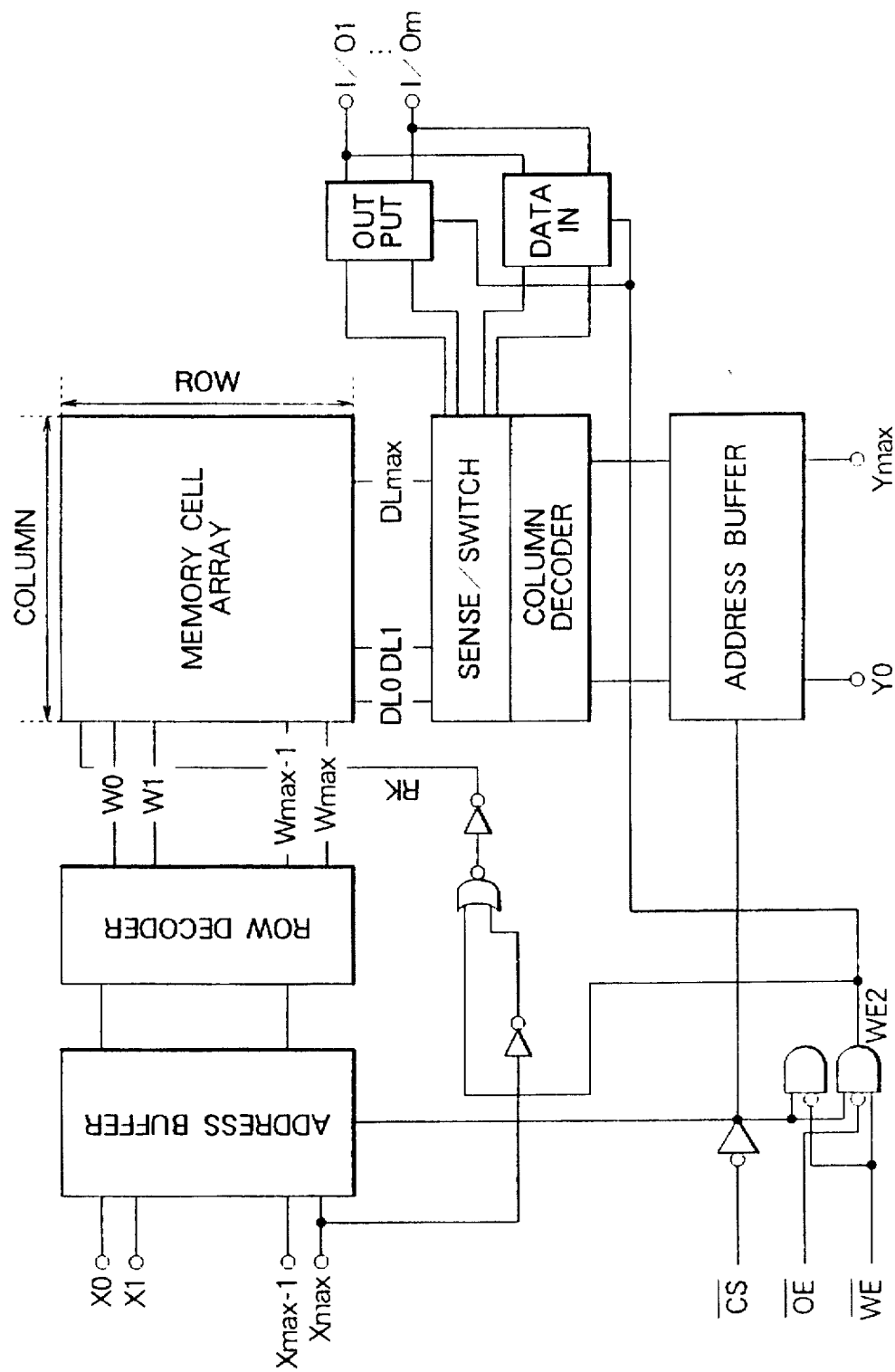
FIG. 9A is a block diagram showing the structure of an ordinary memory circuit including the circuit in FIG. 7A.
Figure 9B:
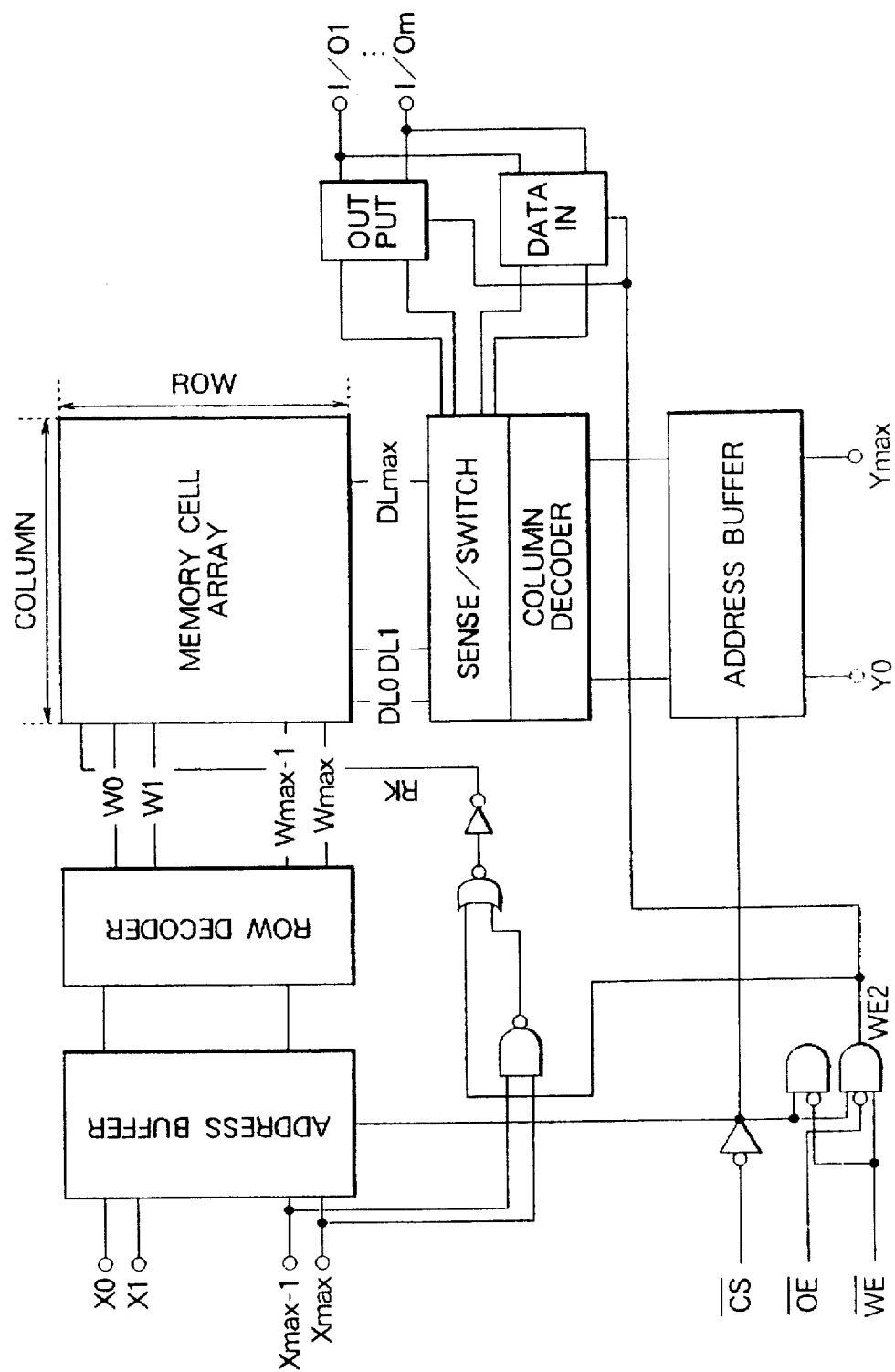
FIG. 9B is a block diagram showing the structure of an ordinary memory circuit including the circuit in FIG. 7B.
Figure 10:
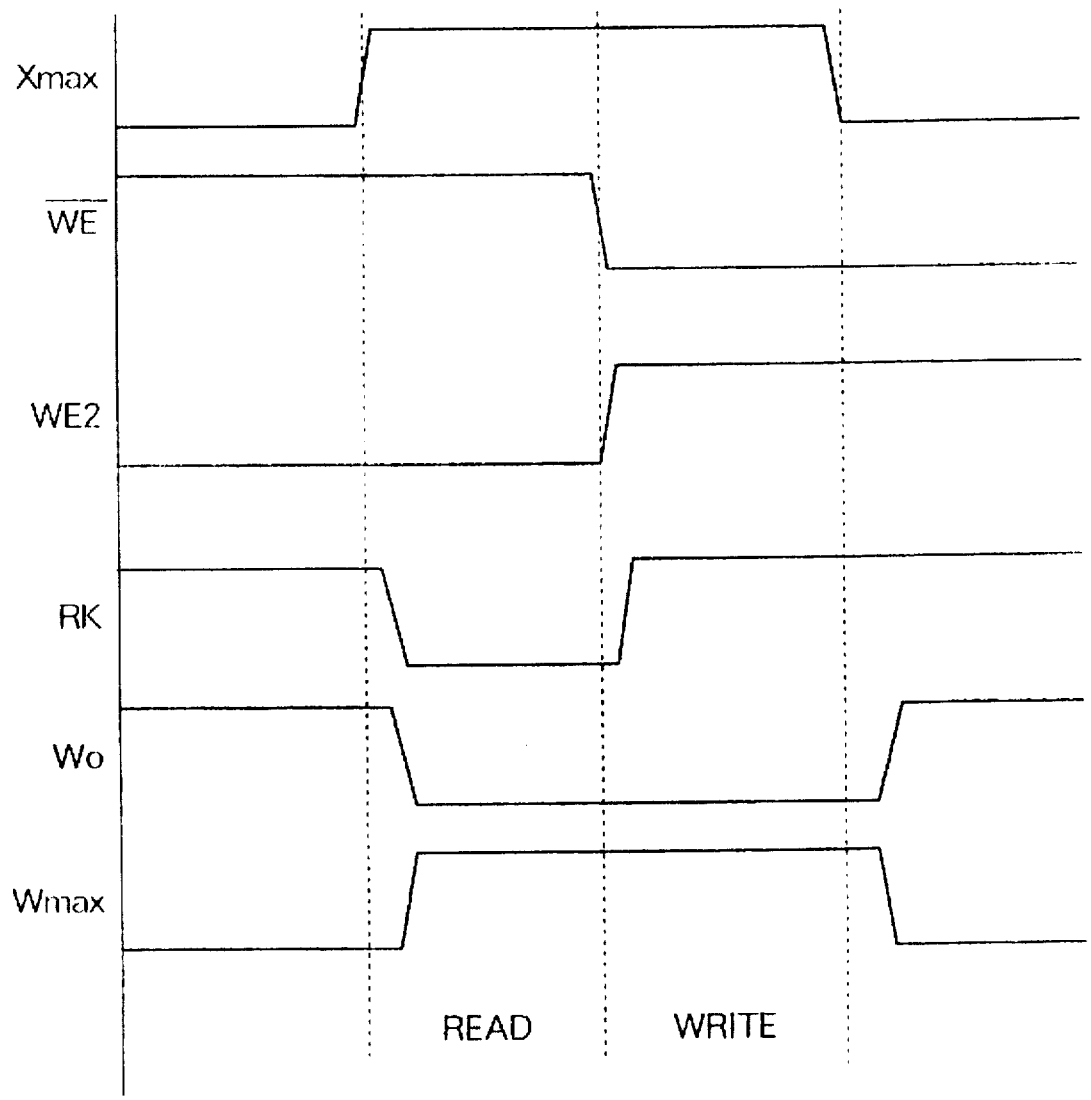
FIG. 10 is a timing chart for explaining the operations of the circuits in FIGS. 7A and 7B.

FIG. 9A is a block diagram of a RK signal generator which includes the circuit in FIG. 7A, and FIG. 9B is a block diagram of a RK signal generator which includes the circuit in FIG. 7B. The input signal Xmax to an address buffer is input to the circuit in FIG. 7A, and the RK signal is input to the memory cell array. The input signals Xmax and Xmax−1 to the address buffer are input to the circuit in FIG. 7B, and the RK signal is input to the memory cell array. FIG. 10 presents a timing chart illustrating the operation.

Referring to FIGS. 7A and 9A, the inverted signal of the most significant bit Xmax is input together with the write/read enable signal WE2 to a NOR gate in the clamp control signal generator, which outputs the inverted signal of the output of the NOR gate as the clamp control signal RK. The clamp control signal RK is at a low level when the most significant bit Xmax has a high level (="1") and the write/read enable signal WE2 has a low level.

Referring to FIGS. 7B and 9B, the logical product of the bits Xmax and Xmax−1 is input together with the write/read enable signal WE2 to a NOR gate in the clamp control signal generator, which outputs the inverted signal of the output of the NOR gate as the clamp control signal RK. The write/read enable signal WE2 is set to a high level in a write mode and is set to a low level in a read mode.

Figure 8:
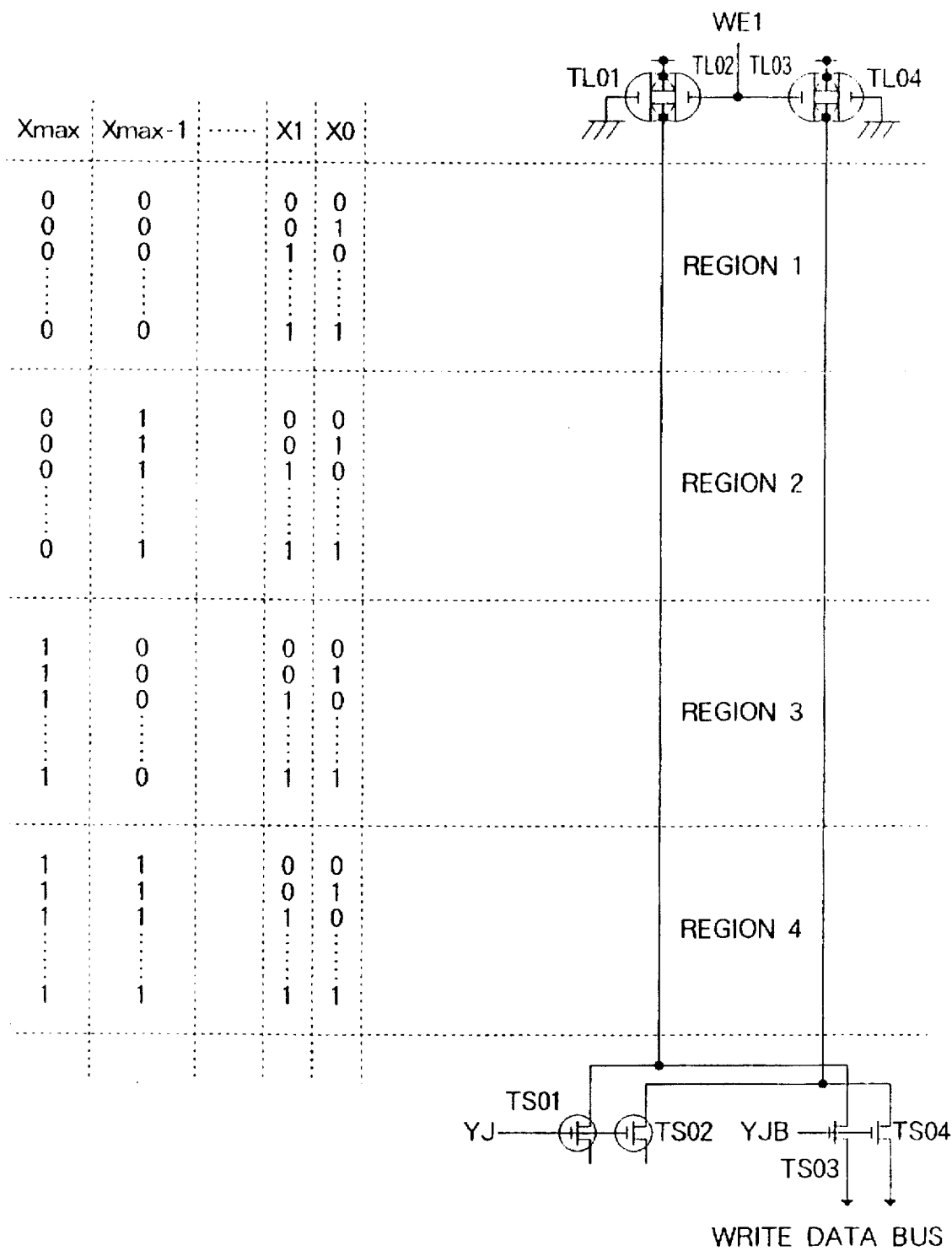
FIG. 8 is a diagram for explaining one example of the relationship between a row address signal and a selected memory cell in a semiconductor memory device.

FIG. 8 is a correlation diagram for explaining the relationship between the row address signal and a selected memory cell in the semiconductor memory device. More specifically, FIG. 8 shows the relationship between the memory cells connected to one pair of digit lines and the row address signal. In the diagram, "X0," "X1," ..., "Xmax−1" and "Xmax" respectively represent the least significant bit to the most significant bit of the row address signal. The row address signal is decoded in such a manner that one memory cell is selected from an area 3 or an area 4 when Xmax is at a high level, one memory cell is selected from an area 2 or the area 4 when Xmax−1 is at a high level, and one memory cell is selected from the area 4 when Xmax and Xmax−1 both have high levels.

This embodiment will be described more specifically referring to FIGS. 3, 4, 7 and 8.

As the logic circuit shown in FIG. 7A is used for the clamp control signal generator in this embodiment, the clamp control signal RK becomes active only when the semiconductor memory device is in the read mode and one memory cell is selected from the area 3 or the area 4 shown in FIG. 8. The following will discuss the operation of the embodiment shown in FIG. 3 in the same procedures as have been explained for the prior art.

When the memory cell CE1 in the area 1 is selected with the word line W0 set to a high level, the clamp control signal RK goes high and the transistor TK01 is turned off, the potential of the digit line DLB1 drops by the voltage drop which is caused when the activation current for the memory cell CE1 flows through the ON resistors of the parallel connected load transistors TL03 and TL04.

Because the internal node N11 of the memory cell CE2 is at a high level, no activation current flows through digit line DL, causing no voltage drop, so that the potential at the digit line DL1 stays at the supply voltage.

The potential difference VDL2 between the digit line pair DL1 and DLB1 when the memory cell CE1 is selected is therefore given by the following equation (4):

$$VDL2 = RTL34 \times IC \quad (4)$$

where RTL34 is the combined resistance of the ON resistances of the load transistors TL03 and TL04 connected in parallel, and IC is the activation current of the memory cell CE1.

Normally, the activation current IC of memory cells is approximately 100 µA. The potential difference of complementary signals input to the sense amplifier which is constituted of bipolar transistors should be approximately 100 mV in the light of the operational margin or the like. Therefore, the potential difference of the digit line pair should be approximately 100 mV.

As described earlier in the section of the Related Art, a semiconductor memory device with the memory capacity of 1 Mbits has 512 to 1024 memory cells connected to one pair of digit lines, and the resistance of the parasitic resistor of the pair of digit lines to which, for example, 512 memory cells are connected is approximately 500 Ω, and the parasitic capacitance is about 1 pF.

When the activation current IC of the memory cells is equal to 100 µA and the potential difference VDL2 between the digit line pair is equal to 100 mV, the ON resistance of the transistors as the load elements TL03 and TL04 (or TL01 and TL02) of the digit line pair should be set to RTL34 (=RTL12)=1 kΩ.

When the word line Wmax is set to a high level and the memory cell CE2 in the area 4 is selected under this situation, the clamp control signal RK goes low and the transistor TK01 is turned on. Consequently, the potential of the digit line DL1 drops from the supply voltage by the voltage drop, which is caused when the activation current of the memory cell CE2 flows across the combined resistor, which is acquired by combining the series circuit of the parallel combined resistor RTL34 of the ON resistors of the load transistors TL03 and TL04, connected in parallel, and the ON resistor RTK1 of the transistor TK01 (=RTL34+RTK1) and the series circuit of the parallel combined resistor RTL12 of the ON resistors of the load transistors TL01 and TL02, connected in parallel, and the parasitic resistor R1 of the digit line DL.

The potential DL1 of the digit line DL when the memory cell CE2 is selected is given by the following equation (5) where IC is the activation current of the memory cell CE2.

$$DL1 = [\{RTL12 \times (RTL34+RTK1)\}/\{RTL12+(RTL34+RTK1)\}+R1] \times IC \quad (5)$$

By setting the ON resistance RTK1 of the clamping transistor TK01 to 2 kΩ in the equation (5), the potential of the digit line DL1 is given by the following equation (6).

$$DL1 = \text{supply voltage} - 125 \text{ mV} \quad (6)$$

The activation current IC (=100 µA) of the memory cell then is the sum of 75 µA supplied from the load elements TL01 and TL02 on the digit line DL side and 25 µA supplied from the load elements TL03 and TL04 on the digit line DLB side. Thus, the current which flows through the clamping transistor TK01 becomes 25 µA, so that the potential of the digit line DLB1 is given by the following equation (7).

$$DLB1 = \text{supply voltage} - 25 \text{ mV} \quad (7)$$

From the equations (6) and (7), therefore, the potential difference VDL1 between the digit line pair DL1 and DLB1 becomes approximately 100 mV as given by the following equation (8).

$$\begin{aligned} VDL1 &= (\text{supply voltage} - 25 \text{ mV}) - \\ &\quad (\text{supply voltage} - 125 \text{ mV}) \\ &= 100 \text{ mV} \end{aligned} \quad (8)$$

That is, the potential VDL1 between the digit line pair DL1 and DLB1 when the memory cell CE2 is selected becomes equal to the potential VDL2 between the digit line pair DL1 and DLB1 when the memory cell CE1 is selected.

A description will now be given of the delay time for outputting data to the digit line pair from a memory cell.

When the memory cell CE2 becomes unselected and the memory cell CE1 becomes selected, as mentioned above, the potentials of the digit line pair change in such a way that the word line Wmax is first set to a high level, the potential of the digit line DL1 with the memory cell CE2 selected is the supply voltage minus 125 mV, and the potential of the digit line DLB1 is the supply voltage minus 25 mV.

When the word line Wmax goes low from this condition and the word line W0 goes high at the same time, the potential of the digit line DL1 rises to the supply voltage from the supply voltage minus 125 mV, and the potential of the digit line DLB1 drops to the supply voltage −100 mV from the supply voltage.

Suppose that the delay time T1 for the data output to the digit line pair from a memory cell, when the memory cell CE2 is unselected and the memory cell CE1 is selected, ranges from the point when the falling waveform of the word line Wmax cross the rising waveform of the word line W0 to the point when the potential waveforms of the digit line pair DL1 and DLB1 cross each other (see FIG. 4).

When the memory cell CE1 becomes unselected from the selected state and the memory cell CE2 becomes selected from the unselected state, the potentials of the digit line pair change in such a way that the word line W0 is first set to a high level, the potential of the digit line DLB1 with the memory cell CE1 selected is the supply voltage minus 100 mV, and the potential of the digit line DL1 is the supply voltage.

When the word line W0 goes low from this condition and the word line Wmax goes high at the same time, the potential of the digit line DLB1 rises to the supply voltage minus 25 mV from the supply voltage minus 100 mV, and the potential of the digit line DL1 drops to the supply voltage −125 mV from the supply voltage.

Suppose that the delay time T2 for the data output to the digit line pair from a memory cell, when the memory cell CE1 is unselected and the memory cell CE2 is selected, ranges from the point when the rising waveform of the word line Wmax cross the falling waveform of the word line W0 to the point when the potential waveforms of the pair of digit lines DL1 and DLB1 cross each other. The data output delay time T1 when the memory cell CE2 is unselected and the memory cell CE1 is selected becomes substantially the same as the data output delay time T2 when the memory cell CE1 is unselected and the memory cell CE2 is selected, and becomes shorter than the data output delay time T1 in the prior art by the reduced amounts of the initial amplitudes of the potentials of the digit line pair.

Even if the circuit in FIG. 7B is used for the clamp control signal (RK) generator, the potential changes for the digit line pair in the read mode are the same as those explained above.

Another embodiment of the present invention will now be discussed.

Figure 5:
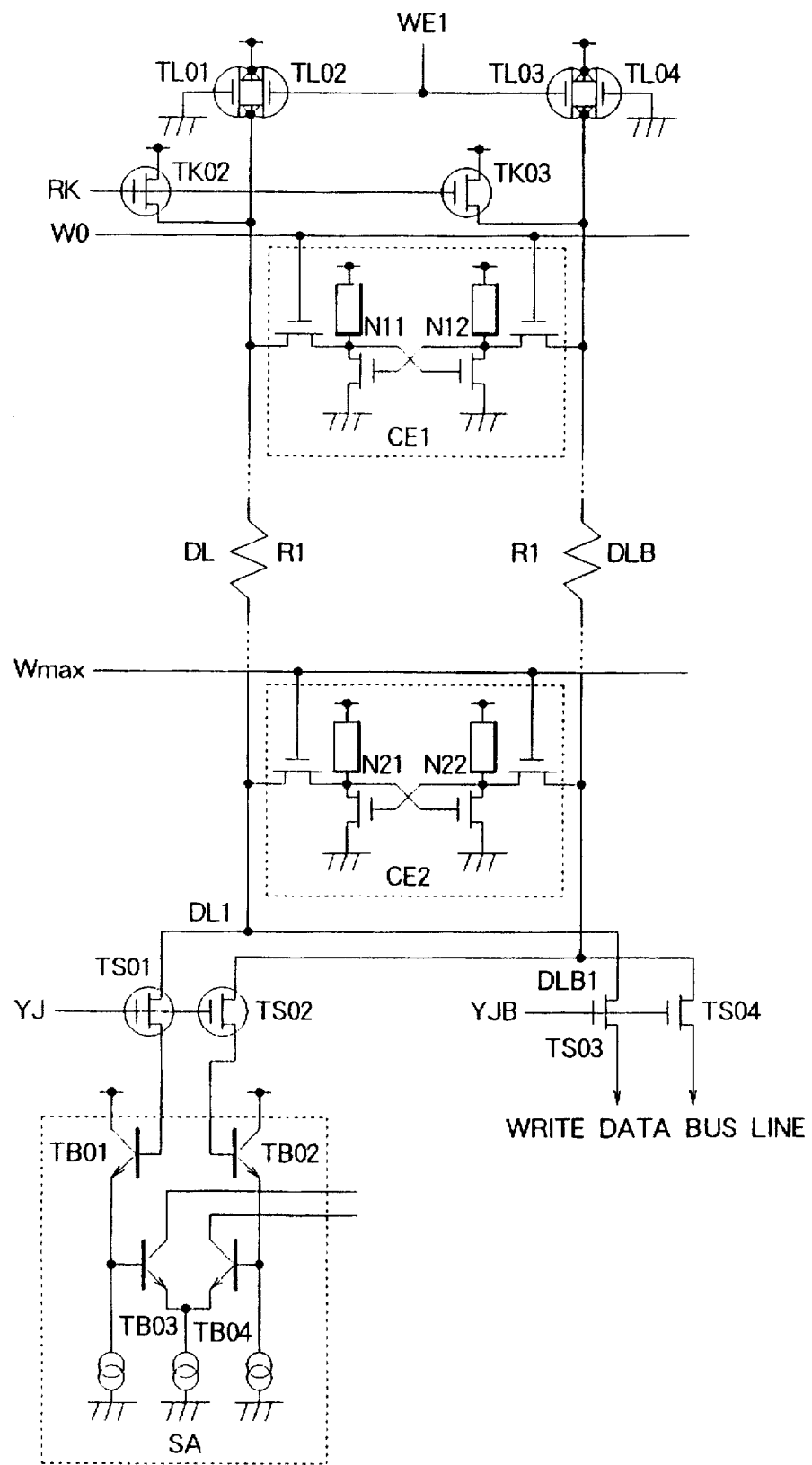
FIG. 5 is a diagram showing the structure of another embodiment of this invention.

FIG. 5 is a circuit diagram showing a pair of digit lines in a semiconductor memory device according to one embodiment of this invention and the circuit of a sense amplifier which is connected to the digit line pair. In the diagram, "DL" and "DLB" denote the pair of digit lines, and "TL01" and "TL04" denote floating-preventing load transistors whose gates are grounded, and "TL02" and "TL03" denote load transistors for controlling the potential difference between the pair of digit lines at the time of signal reading. The load transistors TL02 and TL03 have their gates both connected to WE1, one of write/read enable signals. "R1" shows the parasitic resistors of the digit line pair.

"TS01" and "TS02" denote digit line pair (DLP) select transistors whose gates are connected to a column address decode signal YJ, and which connect the selected digit line pair to a sense amplifier which is constituted of bipolar transistors TB01, TB02, TB03 and TB04. Likewise, "TS03" and "TS04" denote DLP select transistors whose gates are connected to a column address decode signal YJB, and which connect the selected digit line pair to a write data bus line.

"CE1" and "CE2" are static memory cells each comprising two load elements and four transistors. The memory cell CE1 is located closest to the load transistors TL01, TL02, TL03 and TL04 and is selected by a word line W0. The memory cell CE2 is located closest to the select transistors TS01 and TS02, and is selected by a word line Wmax.

"TK02" and "TK03" are transistors provided at the digit line pair on the side of the load transistors TL01, TL02, TL03 and TL04. Those transistors TK02 and TK03 serve to clamp the potential difference between the digit line pair DL and DLB. The gates of the transistors TK02 and TK03 are commonly connected to a clamp control signal RK which is produced by a predetermined logical operation on the write/read enable signal and a row address signal for selecting an arbitrary memory cell in the memory cell array connected to the digit line pair.

Figure 6:
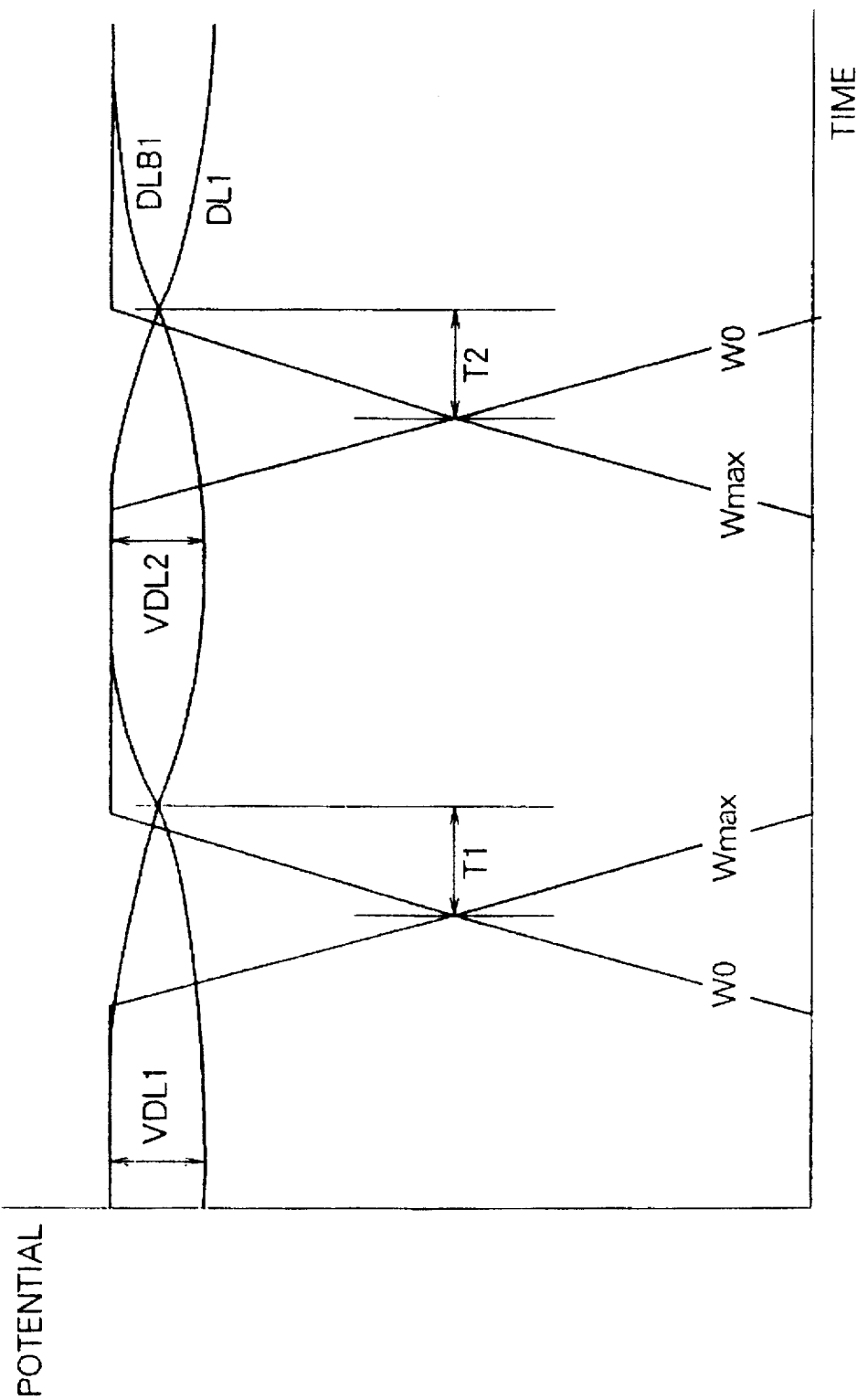
FIG. 6 is a diagram showing signal waveforms for explaining a reading operation of this another embodiment.

FIG. 6 shows the operation waveforms for the reading operation of the semiconductor memory device according to this embodiment when the internal node N11 of the memory cell CE1 is at a high level, the internal node N12 thereof is at a low level, the internal node N21 of the memory cell CE2 is at a low level, and the internal node N22 thereof is at a high level. In the diagram, "DL1" shows the potential waveform of the digit line DL on the TS01 side, "DLB1" shows the potential waveform of the digit line DLB on the TS02 side, "VDL1" shows the potential difference of the digit line pair when the memory cell CE2 is selected, and "VDL2" shows the potential difference of the digit line pair when the memory cell CE2 is selected.

As the logic circuit shown in FIG. 7A is used for the clamp control signal generator in this embodiment, the clamp control signal RK becomes active only when the semiconductor memory device is in the read mode and one memory cell is selected from the area 3 or the area 4 shown in FIG. 8. The following will discuss the operation of the embodiment shown in FIG. 5 in the same procedures as have been explained for the prior art.

When the memory cell CE1 in the area 1 is selected with the word line W0 set to a high level, the clamp control signal RK goes high and the transistors TK02 and TK03 both remain off, the potential of the digit line DLB1 on the DLP select transistor TS03 side drops by the voltage drop which is caused when the activation current for the memory cell CE1 flows through the ON resistors of the parallel connected load transistors TL03 and TL04.

Because the internal node N11 of the memory cell CE2 is at a high level, no activation current flows through digit line DL, causing no voltage drop, so that the potential at the digit line DL1 on the DLP select transistor TS01 stays at the supply voltage.

The potential difference VDL2 between the digit line pair DL1 and DLB1 when the memory cell CE1 is selected is therefore given by the following equation (9):

$$VDL2 = RTL34 \times IC \qquad (9)$$

where RTL34 is the combined resistance of the ON resistances of the load transistors TL03 and TL04 connected in parallel, and IC is the activation current of the memory cell CE1.

When the activation current IC of the memory cells is equal to 100 μA and the potential difference VDL2 between the digit line pair DL1 and DLB1 is equal to 100 mV, the ON resistance of the transistors as the load elements TL03 and TL04 (or TL01 and TL02) of the digit line pair is set to RTL34 (=RTL12)=1 kΩ.

When the word line Wmax is set to a high level and the memory cell CE2 in the area 4 is selected under this situation, the clamp control signal RK goes low and the transistors TK02 and TK03 are turned on. Therefore, the potential of the digit line DL1 drops from the supply voltage by the voltage drop, which is caused when the activation current of the memory cell CE2 flows across the combined resistor, which is acquired by combining the series circuit of the parallel combined resistor RTL12 of the ON resistors of the load transistors TL01 and TL02, connected in parallel, and the ON resistor RTK2 of the transistor TK02, and the parasitic resistor R1 of the digit line DL.

Because the internal node N22 of the memory cell CE2 is at a high level, no activation current flows through the digit line DLB, causing no voltage drop, so that the potential of the digit line DLB1 stays at the supply voltage.

The potential difference DL1 between the digit line pair DL1 and DLB1 when the memory cell CE2 is selected is given by the following equation (10) where IC is the activation current of the memory cell CE2.

$$VDL1=\{RTL12 \times RTK2)/(RTL12+RTK2)+R1\} \times IC \quad (10)$$

By setting the ON resistance RTK2 of the clamping transistor TK02 to 1 kΩ in the equation (10), VDL1 is given by the following equation (11).

$$VDL1=\text{supply voltage}-100 \text{ mV} \quad (11)$$

That is, the potential VDL1 between the digit line pair DL1 and DLB1 when the memory cell CE2 is selected becomes equal to the potential VDL2 between the digit line pair DL1 and DLB1 when the memory cell CE1 is selected.

A description will now be given of the delay time for outputting data to the digit line pair from a memory cell.

When the memory cell CE2 becomes unselected from the selected state and the memory cell CE1 becomes selected from the unselected state, as mentioned earlier, the potentials of the digit line pair change in such a way that the word line Wmax is first set to a high level, the potential of the digit line DL1 with the memory cell CE2 selected is the supply voltage minus 100 mV, and the potential of the digit line DLB1 is the supply voltage.

When the word line Wmax goes low from this condition and the word line W0 goes high at the same time, the potential of the digit line DL1 rises to the supply voltage from the supply voltage minus 100 mV, and the potential of the digit line DLB1 drops to the supply voltage −100 mV from the supply voltage.

Suppose that the delay time T1 for the data output to the digit line pair from a memory cell, when the memory cell CE2 is unselected and the memory cell CE1 is selected, ranges from the point when the falling waveform of the word line Wmax cross the rising waveform of the word line W0 to the point when the potential waveforms of the digit line pair DL1 and DLB1 cross each other (see FIG. 6).

When the memory cell CE1 becomes unselected and the memory cell CE2 becomes selected, the potentials of the digit line pair change in such a way that the word line W0 is first set to a high level, the potential of the digit line DLB1 with the memory cell CE1 selected is the supply voltage minus 100 mV, and the potential of the digit line DL1 is the supply voltage.

When the word line W0 goes low from this condition and the word line Wmax goes high at the same time, the potential of the digit line DLB1 rises to the supply voltage from the supply voltage minus 100 mV, and the potential of the digit line DL1 drops to the supply voltage −100 mV from the supply voltage.

Suppose that the delay time T2 for the data output to the digit line pair from a memory cell, when the memory cell CE1 is unselected and the memory cell CE2 is selected, ranges from the point when the rising waveform of the word line Wmax cross the falling waveform of the word line W0 to the point when the potential waveforms of the pair of digit lines DL1 and DLB1 cross each other (see FIG. 6). The data output delay time T1 when the memory cell CE2 is unselected and the memory cell CE1 is selected becomes substantially the same as the data output delay time T2 for the data output to the digit line pair from a memory cell when the memory cell CE1 is unselected and the memory cell CE2 is selected.

Even in the example where the circuit in FIG. 7B is used for the clamp control signal (RK) generator, the potential changes for the digit line pair in the read mode are the same as those explained above.

Although the foregoing description has been given of the individual embodiments, this invention is not limited to those particular embodiments, but may be embodied in many other specific forms based on the principles of this invention.

What is claimed is:

1. A semiconductor memory device comprising:

at least one pair of digit lines, at least one sense amplifier coupled to said at least one pair of digit lines, a first memory cell disposed adjacently to said at least one sense amplifier, a second memory cell disposed distantly from said at least one sense amplifier, a selecting circuit responding to first address information to select said first memory cell and responding to second address information to select said second memory cell, each of said first and second memory cells generating, when selected, a potential difference between said at least one pair of digit lines in response to data stored therein, and a control circuit activated when said first memory cell is selected and deactivated when said second memory cell is selected, said control circuit suppressing, when activated, the potential difference between said at least one pair of digit lines.

2. A semiconductor memory device according to claim 1 comprising:

a transistor coupled between said digit lines to clamp a potential difference between the digit lines.

3. A semiconductor memory device according to claim 1 comprising:

transistors coupled to said digit lines respectively to clamp a potential difference between the digit lines.

4. A semiconductor memory device comprising:

at least one digit line, a plurality of memory cells each coupled to said at least one digit line, a load circuit coupled between one end of said at least one digit line and a voltage line, a selection circuit selecting one of said memory cells in response to address information, and a control circuit setting a load resistance value of said load circuit to a first value when a memory cell disposed adjacently to said load circuit is selected and to a second value when another memory cell disposed distantly from said load circuit is selected, said second value being smaller than said first value.

5. A semiconductor memory device comprising:

a memory cell array including a plurality of memory cells arranged in a matrix form having a plurality of rows and columns, a plurality of digit lines arranged in a column direction and each coupled to the memory cells arranged in an associated column, a plurality of word lines arranged in a row direction and each coupled to the memory cells arranged in an associated row, and a load circuit for electrically coupling one end of each of said digit lines to a voltage source line, said memory cells being divided into at least first and second groups, said first group including the memory cells disposed near to said load circuit and said second group including the memory cells disposed apart from said load circuit, and a control circuit for decreasing a load resistance of said load circuit when one of the memory cells contained in said second group is selected, as compared to when one of the memory cells contained in said first group is selected.

* * * * *